(12) United States Patent
Manea

(10) Patent No.: US 6,621,745 B1
(45) Date of Patent: Sep. 16, 2003

(54) ROW DECODER CIRCUIT FOR USE IN PROGRAMMING A MEMORY DEVICE

(75) Inventor: Danut I. Manea, Cupertino, CA (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 10/174,632

(22) Filed: Jun. 18, 2002

(51) Int. Cl.$^7$ .............................................. G11C 16/06
(52) U.S. Cl. ........................... 365/185.23; 365/185.22; 365/230.06
(58) Field of Search ....................... 365/185.23, 185.22, 365/230.06, 189.11, 189.12, 185.03

(56) References Cited

U.S. PATENT DOCUMENTS

| | | | |
|---|---|---|---|
| 5,978,277 A | 11/1999 | Hsu et al. ............... | 365/185.29 |
| 6,009,015 A | 12/1999 | Sugiyama .............. | 365/185.22 |
| 6,122,199 A | * 9/2000 | Zettler .................. | 365/185.23 |
| 6,356,481 B1 | 3/2002 | Micheloni et al. ..... | 365/185.23 |

* cited by examiner

*Primary Examiner*—David Lam
(74) *Attorney, Agent, or Firm*—Thomas Schneck

(57) ABSTRACT

A row decoder circuit for use in programming a memory device. The row decoder circuit includes a means for selecting the wordline of a memory cell to be programmed and a wordline driver circuit that switches between a first power supply line that supplies a programming voltage and a second power supply line that supplies a read/verify voltage in order to provide either the programming voltage or the read/verify voltage to the gate of a selected memory cell on the wordline. This switching between programming and read/verify voltages results in the programming pulses used to program the selected memory cell. The present invention allows for shorter programming pulses to be used and provides faster speed in the overall programming of the memory cell.

22 Claims, 4 Drawing Sheets

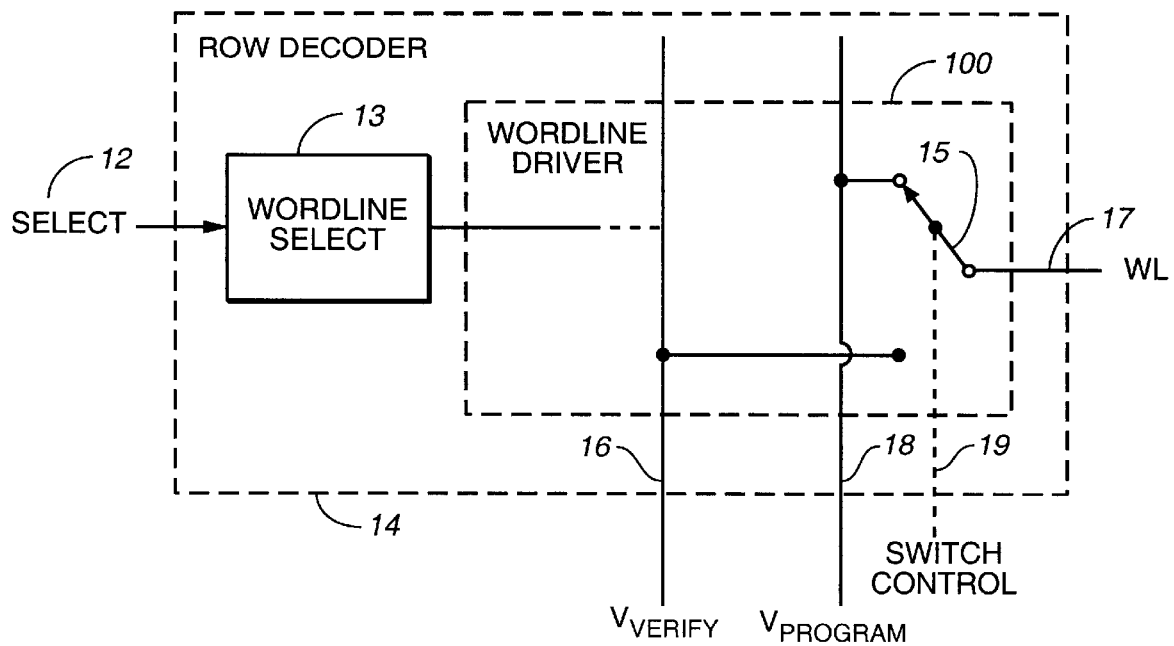
FIG._1
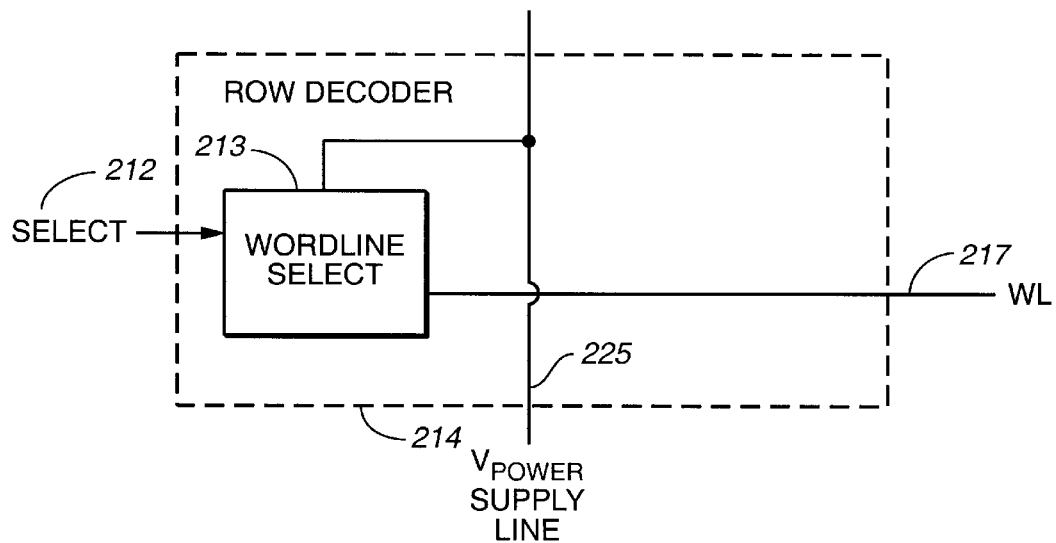
FIG._4
(PRIOR ART)

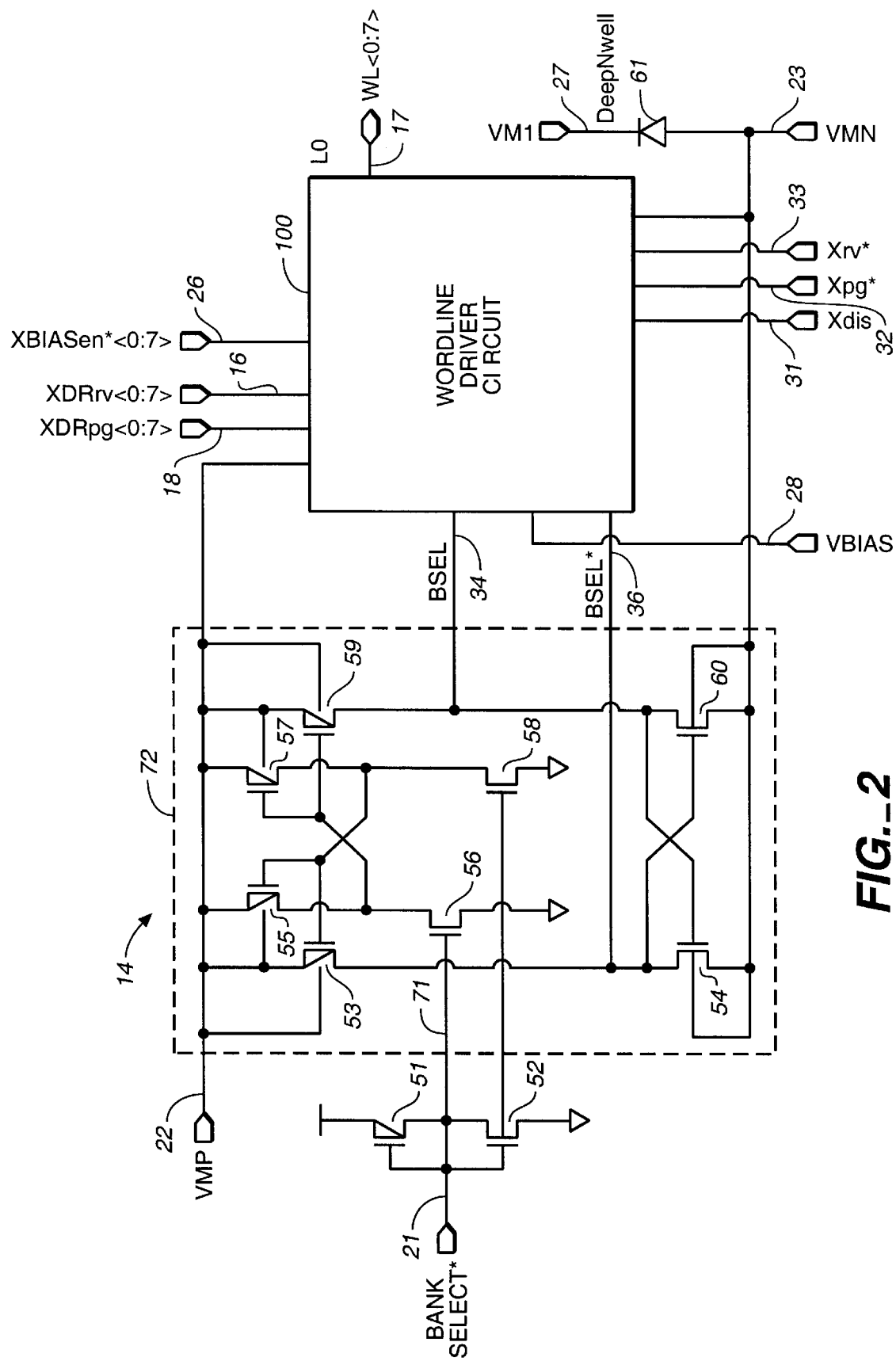
FIG._2

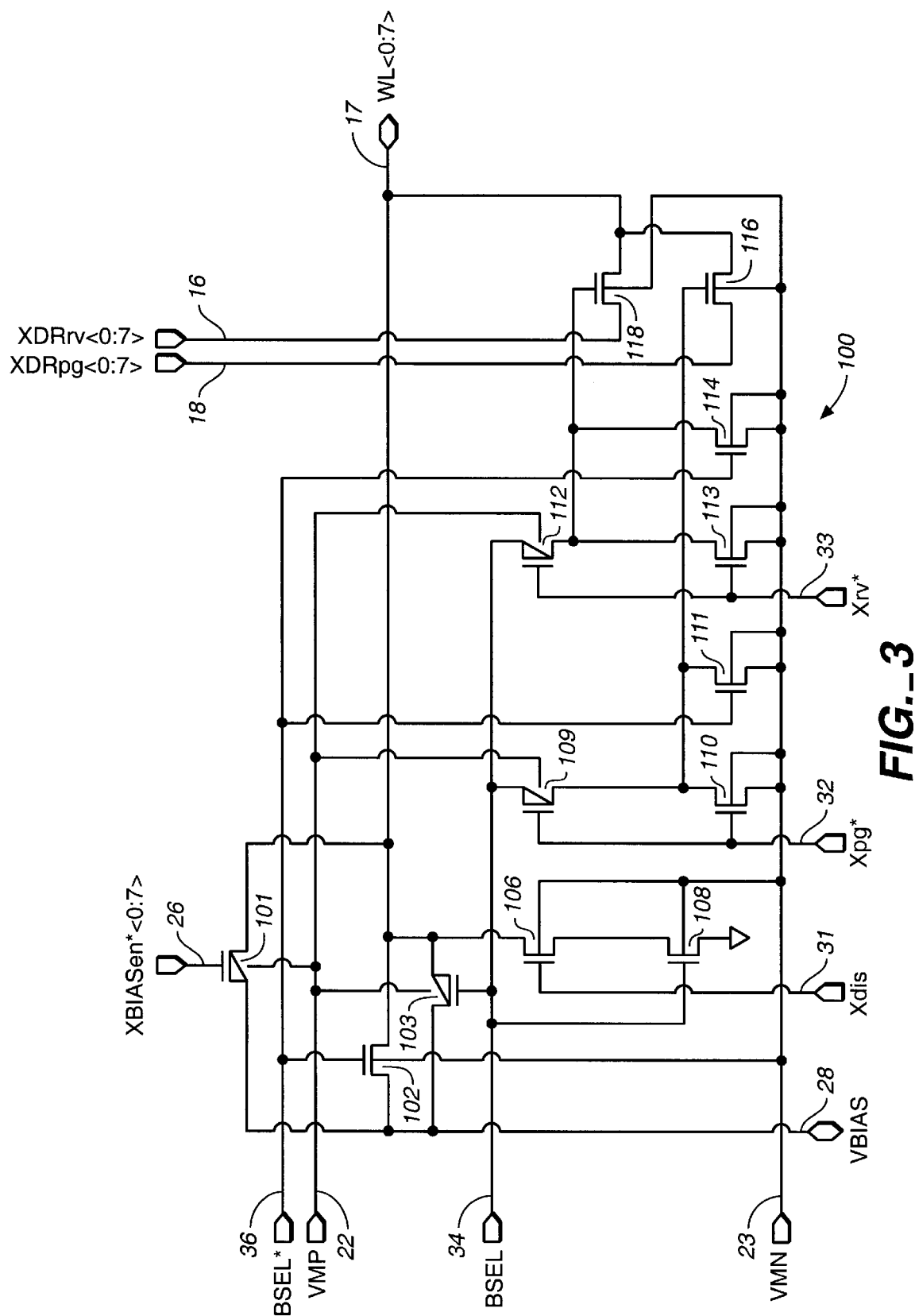
FIG._3

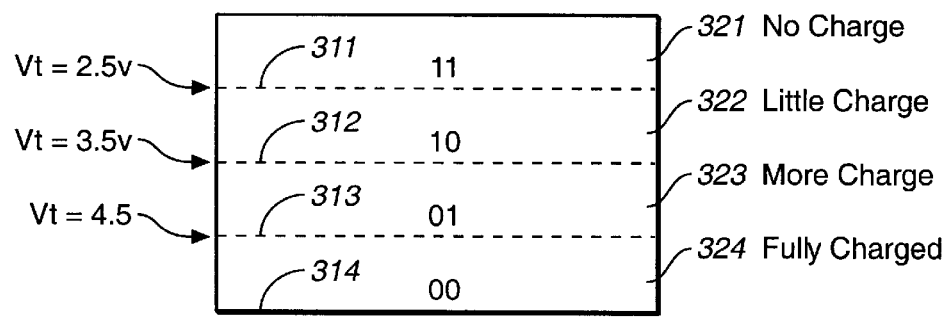
FIG._5
(PRIOR ART)
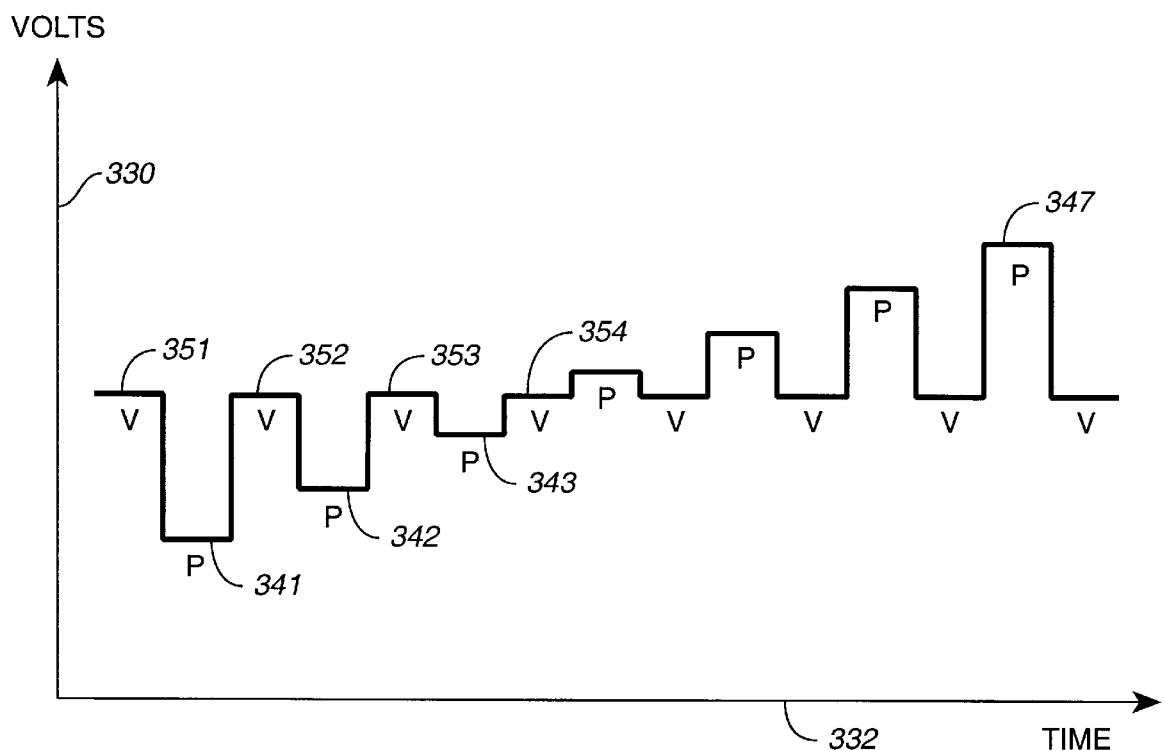
FIG._6
(PRIOR ART)

US 6,621,745 B1

ROW DECODER CIRCUIT FOR USE IN PROGRAMMING A MEMORY DEVICE

TECHNICAL FIELD

This invention relates to semiconductor memory devices, and more particularly to a row decoder circuit for use in programming memory devices.

BACKGROUND ART

In conventional single bit per cell memory devices, the memory cell assumes one of two information storage states, either an on-state or an off-state. This combination of either on or off defines one bit of information. In bi-level memories, since the cells can only have two different values of threshold voltage, Vt, during the reading operation, it is only necessary to sense whether or not the addressed transistor is conductive. This is generally done by comparing the current flowing through the memory transistor biased with predetermined drain-to-source and gate-to-source voltages with that of a reference transistor under the same bias conditions, either directly through current-mode sensing or after a current-to-voltage conversion through voltage-mode sensing.

In programming a typical flash memory cell, a high potential (such as, for example, approximately 3–12 volts) is applied to the control gate of the cell, the source terminal is grounded, and the drain terminal is connected to a voltage of about 5 volts. This operation can be performed in an array by selectively applying the pulse to the word line which connects the control gates, and biasing the bit line which connects the drains. This is commonly known in the art as the hot electron injection method of programming flash memory cells. Hot electron injection is used to move charge into the floating gate, thus changing the threshold voltage of the floating gate transistor. By placing the high voltage on the control gate, this generates electrons to flow in the channel and some hot electrons are injected on to the floating gate and change the potential of the floating gate to be more negative. Therefore, injection tends to saturate and the threshold voltage of a floating gate transistor follows the same trend. The state of the memory cell transistor is read or sensed by placing an operating voltage (for example, approximately 4–6 volts) on its control gate and approximately 0.5–1.0 volts on the drain, and then detecting the level of current flowing between the source and drain to determine which memory state the cell is in.

Programming and sensing schemes for multi-level memory devices are more complex, typically requiring $2^n-1$ voltage references, where n is the number of bits stored in the cell. With reference to FIG. 5, an example of a prior art multi-level memory device is shown having two bits per cell which corresponds to four memory levels having three voltage references. A first memory level 321, represented by the binary number 11, is the state in which the memory cell has no charge. The memory level 324 in which the memory cell is fully charged is represented by the binary number 00. (The terms "no charge" and "fully charged" are used herein, and throughout this discussion, for the purposes of explanation and are not intended to be limiting. For example, the (11) state could have a slight amount of charge and the (00) state could have less than the absolute maximum amount of charge.) In between the uncharged state (11) 121 and the fully charged state (00) 324 are a first intermediate level 322, represented by the binary number 10, in which the memory cell has a small amount of charge, and a second intermediate level 323, represented by the binary number 01, in which the memory cell has more charge than the 10 state but is not fully charged. The threshold voltages (Vt) shown in between each of the memory states of the memory cell represent the threshold voltages needed to transition between memory cell states. As discussed for a two-bit cell having four memory levels, there are three voltage references 311, 312, 313. For example, at the threshold voltage of 2.5 volts, the memory state is at the reference level 311 where the state of the cell will transition from the 11 state to the 10 state. At a voltage threshold Vt=3.5 volts, the memory cell is at the reference level 312 where the state of the cell will transition from the 10 state to the 01 state. And at the voltage threshold of Vt=4.5 volts, the memory cell is at the reference level 313 where the state of the cell will transition from the 01 state to the 00 state. The threshold voltage values shown in FIG. 5 are merely illustrative and the actual values of Vt will depend on the construction of the memory cell.

One of the main difficulties in implementing multi-level nonvolatile memory cells is being able to accurately program the cell, i.e. to place just the amount of charge on the floating gate of the cell transistor that is required to obtain the target value of the threshold voltage. The usual manner that is used in the prior art to deal with the problem of accurate charge placement is by using a cell-by-cell program and verify approach. In the program and verify approach, the programming operation is divided into a number of partial steps and the cell is sensed after every step to determine whether or not the target threshold voltage is achieved, so as to continue the programming if this is not the case. As each cell is independently controlled during programming, this technique allows simultaneous programming of a whole byte or even a number of bytes. This procedure ensures that the target Vt is reached, with the accuracy allowed by the quantization inherent in the use of finite programming steps. However, this process can be very long and must be controlled by on-chip logic circuitry.

A typical program and verify technique is illustrated in FIG. 6. As shown in FIG. 6, the programming of the memory cell is implemented by an alternating sequence of programming and verifying voltage pulses. The voltage 330 of each programming pulse incrementally increases with respect to time 332 until the desired target voltage is reached. The voltage level of the verify pulse remains constant throughout the programming process. For example as shown, after a first verify pulse 351, a first programming pulse 341 is implemented, and then a second verify pulse 352 follows. A next programming pulse 342 of an incrementally increased potential is applied, followed by a verify pulse 353, followed by a third programming pulse 343 which is increased in voltage from the previous programming pulse 352, followed by a third verify pulse 354 and so on, until the final programming pulse 347 is applied to allow the cell to reach the threshold voltage of the desired memory state. As can be seen in FIG. 6, the shape of the graph resembles a staircase, and this programming method is generally known in the art as staircase gate voltage ramp programming. This staircase method is described in numerous patents, including, for example, U.S. Pat. Nos. 5,043,940; 5,268,870; 5,293,560; and 5,434,825.

Each of the memory cells are arranged in rows (wordlines) and columns (bitlines) in a memory array. Typically, in a flash-type memory array, all of the gate terminals of the cells in a row are connected to the same wordline, while all of the drains of the cells in a column are connected to the same bitline; the sources of all the cells in the sector are connected to a common source line. This arrangement is typically repeated 8 or 16 times to obtain either byte or word output. Outputs of other bit lengths are also possible. In order to address the data in the memory cells within the memory array, row decoder (also referred to as an x-decoder) and column decoder (y-decoder) circuits are used to select the desired memory cells.

As explained above, the programming and verifying (reading) steps in programming both single bit per cell and multi-level memory cells are carried out by applying either a programming pulse or a verify (read) pulse on the control gate of the cell. Since the control gate of the cell is connected to the wordline of the memory array, the wordline is connected to the power supply line on which the programming or verify voltage is supplied. With reference to FIG. 4, a wordline 217 is connected to the control gates (not shown) of each of the memory cells in a particular row of the memory array. A select signal 212 is supplied to a wordline select circuit 213 in the the row decoder 214 to select a memory cell connected to that particular wordline 217. A voltage power supply line 225 is connected to the wordline select circuit 213 to supply the programming or verify pulses for programming the memory cell. As previously explained, the programming voltage is generally different (approximately 3–12 volts) than the verify (read) voltage (approximately 5–6 volts). Therefore, the voltage on the power supply line 225 must be changed back and forth between the programming voltage and the verify voltage. Switching the voltage on the power supply line limits the ability to have programming and verify pulses of a short duration, and thus limits the overall speed of the programming. Additionally, in the multilevel approach, switching the voltage on the power supply line limits the ability to accurately control the programming algorithm.

It is the object of the present invention to provide a row decoder circuit for a memory cell that eliminates the need to change the voltage on the power supply line during the programming of the memory cell.

SUMMARY OF THE INVENTION

The above object has been achieved by a row decoder circuit having means for selecting the wordline of a memory cell to be programmed and having a wordline driver circuit that receives voltages from a pair of separate power supply lines connected to the wordline, including a first power supply line that provides a programming voltage and a second power supply line that provides a read/verify voltage. The wordline driver circuit of the row decoder includes means for switching between the two power supply lines to provide one of the voltages to the wordline. Because the circuit switches between two power supply lines rather than requiring the voltage on a single power supply line to be changed, this allows for shorter programming and read/verify pulses to be used and allows for faster overall programming throughput. The row decoder circuit also provides better control in programming multi-level memory cells, and power savings due to the elimination of parasitic voltages commonly found in prior art row decoder circuits.

BRIEF DESCRIPTION OF THE DRAWINGS

FIG. 1 is a schematic diagram of the row decoder circuit of the present invention.

FIG. 2 is an electrical schematic diagram of an embodiment of the row decoder circuit of the present invention.

FIG. 3 is an electrical schematic diagram of the wordline driver circuit of the row decoder of FIG. 2.

FIG. 4 is a schematic diagram of a row decoder circuit as is known in the prior art.

FIG. 5 is a representation of a two-bit memory cell having four memory states as is known in the prior art.

FIG. 6 is a graph showing the voltage to time relationship for the program and verify pulse steps of the staircase programming method, as is known in the prior art.

BEST MODE FOR CARRYING OUT THE INVENTION

With reference to FIG. 1, the output of the row decoder 14 is a wordline 17 that is connected to the control gates (not shown) of each of the memory cells in a particular row of the memory array. A select signal 12 is supplied to the wordline select circuit 13 of the row decoder 14 to select the wordline 17 connected to the memory cell to be programmed. A wordline driver circuit 100, within the row decoder 14, receives voltages from a pair of power supply lines 16, 18. The first power supply line 18 provides the programming voltage and the second power supply line 16 provides the read/verify voltage. The wordline driver circuit 100 includes a switching means 15 for connecting the wordline 17 to either of the programming voltage power supply line 18 or the read/verify voltage power supply line 16. The switching means 15 receives switch control signals on a switch control line 19. As earlier discussed, the read/verify voltage power supply line 16 provides a read/verify voltage of approximately 5–6 volts, while the programming power supply line 18 provides a programming voltage of approximately 3–12 volts. In contrast to the prior art, in which there is one power supply line and the voltage on the power supply line is required to be switched to provide the programming and read/verify voltages to the wordline, in the present invention the programming and read/verify power supply lines are fixed to the appropriate voltage levels and the wordline is switched between the two power supply lines.

A first embodiment of the row decoder circuit 14 of the present invention is shown in FIG. 2. The row decoder circuit 14 can be implemented in a number of different ways, the circuit of FIG. 2 being exemplary. During an internal operation, a group of one or more rows of the memory array are selected. In one embodiment, the selected group includes eight rows of memory cells. For a group to be selected, the signal BANK SELECT* 21 has to be "true" (in the circuit of FIG. 2, "true" is the low or logic 0 condition). The BANK SELECT* signal is supplied at the input 21 of a logic inverter consisting of p-type MOS transistor 51 and n-type MOS transistor 52. Transistors 53, 54, 55, 56, 57, 58, 59 and 60, configured as shown in FIG. 2, form a double high voltage level shifter circuit 72 which is used to convert the logic select signal into positive and negative high voltage signals, on BSEL line 34 and BSEL* line 36. The VMP signal terminal 22 receives the positive voltage supply VMP of the row decoder, while the VMN signal terminal 23 receives the negative voltage supply VMN. Usually these voltages VMP, VMN are obtained by means of internal charge pumping. When the BANK SELECT* signal on input 21 is true (low), the BSEL line 34 is connected through the double high voltage level shifter circuit 72 to the VMP line 22 and the BSEL* line 36 is connected to the VMN line 23 through transistors 60 and 54. When the BANK SELECT* signal selects a group, all of the rows connected to the wordline driver circuit 100 are subject to selection based on the voltage levels on the programming power supply line 18 and the read/verify power supply line 16. When the BANK SELECT signal is false (high), then the BSEL line 34 is connected through the double high voltage level shifter circuit 72 to the VMN line 23 and the BSEL* line 36 is connected to the VMP 22 line. This makes the group of rows driven by the wordline driver circuit to be in an unselected state. Any unselected rows are connected to a VBIAS voltage, as will be further described below.

Several control signals and voltage lines are connected to the wordline driver circuit 100. The programming power supply line 18 usually has a voltage of 3–12 volts and is the voltage used to supply the programming pulses used in programming the memory cell. The read/verify voltage line 16 has a voltage of about 5–6 volts and is used for providing the read/verify pulses used in the programming of memory cells. The XBIASen* signal line 26 is used to pass a bias voltage to unselected rows when the group is not selected by the bank select signal. The VBIAS line 28 supplies the bias voltage for an unselected group or for an unselected row within a selected group. The program control (Xpg) signal 32 and read/verify control (Xrv) signal 33 are control signals for switching the connection of the wordline 17 to either the programming power supply line 18 or the read/verify power supply line 16. A more detailed discussion of these lines will be described with reference to FIG. 3. The Xdis 31 line is used for discharge purposes of the selected row. The VM1 line 27 is used for the n-well isolation implant of the NT devices. The transistors 54 and 60 are triple well devices and require a separate bias voltage supplied by VM1. Finally, the wordline 17 is the output of the wordline driver circuit 100 and is connected to the control gates of the memory cells in a selected row.

With reference to FIG. 3, the wordline driver circuit 100 is shown. A first n-type transistor 102 is used to pass the bias voltage 28 to the unselected rows during operations other than erase, such as during programming and read/verify operations. P-type transistor 103 is used to pass the bias voltage 28 to the wordline of unselected rows in a selected group during an erase operation. P-type transistor 101 is used to bias the wordline of rows in an unselected group during an erase operation. Transistors 106 and 108 are used to provide a discharge path to ground for the selected row. The program control (Xpg*) signal 32 drives a high voltage inverter consisting of p-type transistor 109 and n-type transistor 110. The read/verify control (Xrv*) signal 33 drives a high voltage inverter consisting of p-type transistor 112 and n-type transistor 113. The program control signal 32 and the read/verify control signal 33 are always in opposite logic states. Both inverters are connected between the BSEL line 34 and the VMN line 23. A pair of n-type transistors 116, 118 have gate terminals connected to the output of inverters 109, 110 and 112, 113 respectively to either pass through or block the respective program and read/verify voltage. Transistors 111 and 114 are used to shut off the inverters if this group is not selected. When the program control signal 32 is true (low), this puts a high signal on the output of the inverter which is supplied to the gate of n-type transistor 116. This turns on transistor 116 to pass the programming voltage from the programming voltage line 18 to the wordline 17. In this case, when the programming control signal is low, the read/verify control signal 33 would be high which would produce a low output at the output of the inverter 112, 113 at the gate of n-type transistor 118. This shuts off transistor 118 so that the read/verify voltage 16 does not go to the wordline.

The values of the control signals 32, 33 are switched to produce the read/verify pulse. In that case, the read/verify control signal 33 goes low, producing a high output at the gate of transistor 118. This turns on transistor 118 and provides the read/verify voltage 16 on the wordline 17. During the read/verify operation, the program control signal 32 is off (or high) which turns off transistor 116 and blocks the programming voltage 18 from going to the wordline 17.

Thus, the wordline driver circuit 100 in the row decoder provides a means for switching between the programming voltage line 18 and the read/verify voltage line 16 for making a connection the wordline 17, thus providing the read/verify and programming pulses necessary to program the memory cell. Again, because the switching can be performed faster, this allows for shorter programming and verifying pulses to be used, which increases the overall speed of the programming operation, saves power, and provides better control in programming multi-level memory cells.

What is claimed is:

1. In a memory array having a plurality of memory cells, each of said memory cells having a plurality of memory states and being programmed to one of said memory states by at least one program pulse being applied to a wordline that is electrically coupled to a gate of a selected memory cell, and the memory state of the memory cell being verified by at least one read/verify pulse being applied to the wordline, a row decoder circuit comprising:

means for selecting the wordline that is electrically coupled to the selected memory cell; and a wordline driver circuit receiving a programming voltage from a first power supply line and a read/verify voltage from a second power supply line, said wordline driver circuit further including means for switching between the programming voltage and the read/verify voltage to supply the at least one program and the at least one read/verify pulse to the wordline, whereby the selected memory cell is programmed.

2. The row decoder circuit of claim 1 wherein the means for switching includes a pair of control signals, each of the control signals being in opposite logic states with respect to each other, a first of said pair of control signals being received at an input of a first inverter having an output connected to a gate of a first pass transistor, said first pass transistor having a drain connected to the first power supply line and a source connected to the wordline, the second of said pair of control signals being received at an input of a second inverter having an output connected to a gate of a second pass transistor, said second pass transistor having a drain connected to the second power supply line and a source connected to the wordline.

3. The row decoder of claim 1 further comprising means for placing a bias voltage on the wordline when the wordline is not selected.

4. The row decoder of claim 1 wherein the means for selecting the wordline includes a selection inverter receiving a row select signal on an input and producing an inverted row select signal on an output, and a shifter circuit receiving the row select signal and the inverted row select signal and producing a pair of complementary select signals.

5. The row decoder of claim 4 wherein the pair of complementary select signals are supplied to the wordline driver circuit.

6. The row decoder of claim 5 wherein the wordline driver circuit receives a pair of control signals, each of the control signals being in opposite logic states with respect to each other, and wherein the wordline driver circuit includes a first inverter having an input to receive a first of said pair of control signals and an output connected to a gate of a first pass transistor, said first pass transistor having a drain connected to the first power supply line and a source connected to the wordline, and a second inverter having an input to receive the second of said pair of control signals and an output connected to a gate of a second pass transistor, said second pass transistor having a drain connected to the second power supply line and a source connected to the wordline.

7. The row decoder circuit of claim 1 wherein the programming voltage substantially ranges from three volts to 12 volts.

8. The row decoder circuit of claim 1 wherein the read/verify voltage substantially ranges from five to six volts.

9. The row decoder of claim 1 wherein the means for selecting the wordline selects a group consisting of eight rows to be driven by the wordline driver circuit.

10. In a memory array having a plurality of memory cells, each of said memory cells having a plurality of memory states and being programmed to one of said memory states by at least one program pulse being applied to a wordline that is electrically coupled to a gate of a selected memory cell, and the memory state of the memory cell being verified by at least one read/verify pulse being applied to the wordline, a row decoder circuit comprising:

means for selecting the wordline that is electrically coupled to the selected memory cell; and a wordline driver circuit, said wordline driver circuit receiving a programming voltage from a first power supply line and a read/verify voltage from a second power supply line and also receiving a pair of control signals, each of the control signals being in opposite logic states with respect to each other, a first of said pair of control signals being received at an input of a first inverter having an output connected to a gate of a first pass transistor, said first pass transistor having a drain connected to the first power supply line and a source connected to the wordline, the second of said pair of control signals being received at an input of a second inverter having an output connected to a gate of a second pass transistor, said second pass transistor having a drain connected to the second power supply line and a source connected to the wordline, whereby the at least one program and read/verify pulses are supplied to the wordline to program the selected memory cell.

11. The row decoder of claim 10 wherein the means for selecting the wordline includes a selection inverter receiving a row select signal on an input and producing an inverted row select signal on an output, and a double high voltage level shifter receiving the row select signal and the inverted row select signal and producing a pair of complementary select signals.

12. The row decoder of claim 11 wherein the pair of complementary select signals are supplied to the wordline driver circuit.

13. The row decoder of claim 12 wherein the wordline driver circuit receives a pair of control signals, each of the control signals being in opposite logic states with respect to each other, and wherein the wordline driver circuit includes a first inverter having an input to receive a first of said pair of control signals and an output connected to a gate of a first pass transistor, said first pass transistor having a drain connected to the first power supply line and a source connected to the wordline, and a second inverter having an input to receive the second of said pair of control signals and an output connected to a gate of a second pass transistor, said second pass transistor having a drain connected to the second power supply line and a source connected to the wordline.

14. The row decoder of claim 11 further comprising means for placing a bias voltage on the wordline when the wordline is not selected.

15. The row decoder of claim 14 wherein the means for selecting the wordline selects a group consisting of eight rows to be driven by a wordline driver circuit.

16. The row decoder circuit of claim 15 wherein the means for placing a bias voltage on the wordline when the wordline is not selected includes a first bias transistor receiving a first one of the complementary select signals on a gate terminal and passing the bias voltage to the wordline of unselected rows during programming or read/verify operations, a second bias transistor receiving a second one of the complementary select signals on a gate terminal and passing the bias voltage to the wordline of unselected rows in a selected group during erase operations, and a third bias transistor receiving a bias enable signal on a gate terminal and passing the bias voltage to the wordline of rows in an unselected group during erase operations.

17. In a memory array having a plurality of multi-level memory cells, each of said memory cells having a plurality of memory states and being programmed to one of said memory states by a series of alternating program and read/verify pulses being applied to a wordline that is electrically coupled to a gate of a selected memory cell, a row decoder circuit comprising:

means for selecting the wordline that is electrically coupled to the selected memory cell; and a wordline driver circuit receiving a programming voltage from a first power supply line and a read/verify voltage from a second power supply line, said wordline driver circuit further including means for switching between the programming voltage and the read/verify voltage to supply the at least one program and the at least one read/verify pulse to the wordline, whereby the selected memory cell is programmed.

18. The row decoder circuit of claim 17 wherein the means for switching includes a pair of control signals, each of the control signals being in opposite logic states with respect to each other, a first of said pair of control signals being received at an input of a first inverter having an output connected to a gate of a first pass transistor, said first pass transistor having a drain connected to the first power supply line and a source connected to the wordline, the second of said pair of control signals being received at an input of a second inverter having an output connected to a gate of a second pass transistor, said second pass transistor having a drain connected to the second power supply line and a source connected to the wordline.

19. The row decoder of claim 17 further comprising means for placing a bias voltage on the wordline when the wordline is not selected.

20. The row decoder of claim 17 wherein the means for selecting the wordline includes a selection inverter receiving a row select signal on an input and producing an inverted row select signal on an output, and a double high voltage level shifter receiving the row select signal and the inverted row select signal and producing a pair of complementary select signals.

21. The row decoder of claim 20 wherein the pair of complementary select signals are supplied to the wordline driver circuit.

22. The row decoder of claim 21 wherein the wordline driver circuit receives a pair of control signals, each of the control signals being in opposite logic states with respect to each other, and wherein the wordline driver circuit includes a first inverter having an input to receive a first of said pair of control signals and an output connected to a gate of a first pass transistor, said first pass transistor having a drain connected to the first power supply line and a source connected to the wordline, and a second inverter having an input to receive the second of said pair of control signals and an output connected to a gate of a second pass transistor, said second pass transistor having a drain connected to the second power supply line and a source connected to the wordline.

* * * * *